United States Patent
Chen et al.

(10) Patent No.: US 9,935,147 B2
(45) Date of Patent: Apr. 3, 2018

(54) DEEP TRENCH ISOLATION STRUCTURE IN IMAGE SENSOR DEVICE

(71) Applicant: TAIWAN SEMICONDUCTOR MANUFACTURING CO., LTD., Hsinchu (TW)

(72) Inventors: Hsin-Hung Chen, Tianan (TW); Dun-Nian Yaung, Taipei (TW); Jen-Cheng Liu, Hsinchu County (TW); Alexander Kalnitsky, San Francisco, CA (US); Wen-De Wang, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/356,578

(22) Filed: Nov. 19, 2016

(65) Prior Publication Data
US 2017/0069670 A1 Mar. 9, 2017

Related U.S. Application Data

(62) Division of application No. 14/839,617, filed on Aug. 28, 2015, now Pat. No. 9,520,433.

(51) Int. Cl.
*H01L 27/146* (2006.01)
*H01L 21/762* (2006.01)
*H01L 21/764* (2006.01)

(52) U.S. Cl.
CPC ........ *H01L 27/1463* (2013.01); *H01L 21/764* (2013.01); *H01L 21/76232* (2013.01); *H01L 27/1464* (2013.01); *H01L 27/14636* (2013.01); *H01L 27/14683* (2013.01)

(58) Field of Classification Search
CPC ........... H01L 27/1463; H01L 27/14618; H01L 27/14636; H01L 27/1468
See application file for complete search history.

(56) References Cited

U.S. PATENT DOCUMENTS

| | | | |
|---|---|---|---|
| 5,783,491 A | 7/1998 | Nakamura et al. | |
| 5,933,749 A | 8/1999 | Lee | |
| 6,627,514 B1* | 9/2003 | Park | H01L 21/76232 257/E21.549 |
| 2005/0176215 A1* | 8/2005 | Jeong | H01L 21/764 438/427 |
| 2015/0372031 A1* | 12/2015 | Yoon | H01L 27/14603 257/446 |
| 2016/0163749 A1* | 6/2016 | Yang | H01L 27/1463 257/446 |

* cited by examiner

*Primary Examiner* — Yasser A Abdelaziez
(74) *Attorney, Agent, or Firm* — Maschoff Brennan

(57) ABSTRACT

An image sensor device includes a substrate having a front surface and a back surface, and a deep trench disposed at the front surface of the substrate. The deep trench has sidewalls, a bottom and an opening. A dielectric layer is disposed along the sidewalls and the bottom of the deep trench. An epitaxial layer is disposed on the front surface of the substrate. The deep trench and the epitaxial layer collectively define an air chamber. The deep trench has a chamfered portion at an interface between the epitaxial layer and the front surface of the substrate. The chamfered portion is free of dielectric layer.

20 Claims, 11 Drawing Sheets

10

| Forming a deep trench isolation structure on a substrate, the substrate having a back surface opposite to a front surface, the deep trench isolation structure opening toward the front surface | ~110 |

↓

| Forming an oxide layer on the front surface of the substrate and sidewalls and bottom of the deep trench isolation structure | ~120 |

↓

| Removing the oxide layer on the front surface of the substrate | ~130 |

↓

| Removing a portion of the substrate at the opening of the deep trench isolation structure | ~140 |

↓

| Forming an epitaxial layer on the substrate | ~150 |

Fig. 1

DEEP TRENCH ISOLATION STRUCTURE IN IMAGE SENSOR DEVICE

The present application is a Divisional application of the U.S. application Ser. No. 14/839,617, filed Aug. 28, 2015, all of which are herein incorporated by reference.

BACKGROUND

Semiconductor image sensors are sued for sensing light. Complementary metal-oxide-semiconductor (CMOS) image sensors (CIS) and charge-coupled device (CCD) sensors can be seen in various applications such as digital still camera or mobile phone camera. These devices employ an array of pixels in a substrate, including photodiodes and transistors, that can absorb radiation projected toward the substrate and convert the sensed radiation into electrical signals.

A back-side illuminated (BSI) image sensor device is one type of image sensor device. As transistor size shrinks with the advance of manufacturing technique, existing BSI image sensor may suffer from issues related to cross-talk and blooming. These issues may be caused by insufficient isolation between neighbouring pixels of the BSI image sensor.

Therefore, while concurrent method of fabricating BSI image sensor devices have been generally adequate for their intended purpose, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a block diagram illustrating a method of fabricating deep trench isolation structure in an image sensor in accordance with some embodiments of the instant disclosure;

DETAILED DESCRIPTION

Figure 2A:
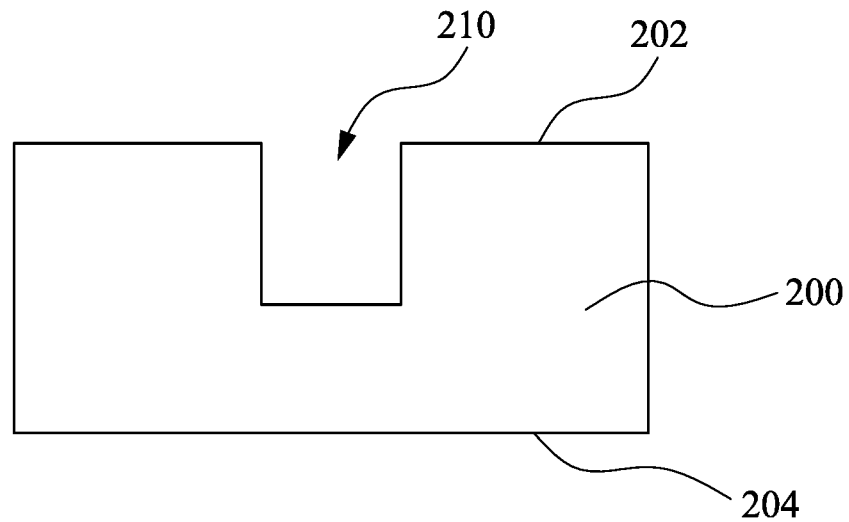
FIGS. 2A-2H are schematic cross-sectional diagrams illustrating the method shown in FIG. 1 in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Back side illuminated image sensor device provides advantages to optical devices. However, a substrate has a front side and a back side, and typically a deep trench isolation pattern is formed at the back side of the substrate after a wafer binds to the substrate. This can lead to limited thermal budget because an annealing temperature cannot exceed 500° C. in the trench formation or subsequent process. Damages or defects caused during the formation of deep trench isolation structure can hardly be repaired because of the temperature restriction. The quality of the isolation layer may be compromised because repairing mechanism cannot be conducted under a temperature higher than 500° C.

Turning now to FIG. 1, illustrated is an embodiment of a method 10 of fabricating deep trench isolation structure in an image sensor device. Embodiments of the method 10 shown in FIG. 1 are further illustrated in the schematic diagrams of FIGS. 2A through 2H, and reference should be made to these figures as called out in the text below.

As set forth in block 110 in FIG. 1, one or more deep trench isolation structure is formed on a front surface of a substrate. This is illustrated in FIG. 2A, which shows the substrate 200 and a trench 210. The substrate 200 may be a device substrate or a semiconductor substrate. The substrate 200 may be a silicon substrate doped with a P-type dopant such as boron. Alternatively, the substrate 200 can be doped with an N-type dopant such as phosphorous or arsenic, in which case the substrate 200 is an N-type substrate. The substrate 200 may include other elementary semiconductors such as germanium and diamond. The substrate 200 may optionally include a compound and or an alloy.

Still referring to FIG. 2A, the substrate has a front surface 202 (also referred to as a front side) and a back surface 204 (also referred to as a back side). For a backside illuminated image (BSI) sensor device, incident radiation enters the substrate 200 through the back surface 204. In some embodiments, the substrate 200 has a thickness ranging from 100 µm to 2000 µm. The substrate 200 includes various regions, which may include a pixel region, a periphery region, a bonding pad region, and a scribe line region. For the sake of simplicity, only a deep trench isolation is shown in FIGS. 2A through 2I.

A patterned hard mask layer (not shown) is formed over the front surface 202 of the substrate 200. The patterned hard mask layer may be formed by forming a hard mask material over the front surface 202 using a deposition process known in the art, such as a chemical vapor deposition (CVD), a physical vapor deposition (PVD) or an atomic layer deposition (ALD). The hard mask material is then patterned in a photolithography process that may involve a photoresist material (not shown) and various exposure, developing, baking, stripping and etching processes. As a result, the patterned hard mask is formed with openings that are further etched to form a deep trench 210, for example, by using a dry etching process known in the art. The deep trench 210 opens at the front surface 202 of the substrate 200. The deep trench 210 has a depth in a range from approximately 1 µm to 3 µm, and in some embodiments, the deep trench isolation structure does not go through the entire depth of the substrate 200. The deep trench 210 may resemble rectangular shape, trapezoidal shape, elongated elliptical shape or any other suitable geometric configuration.

Figure 2B:
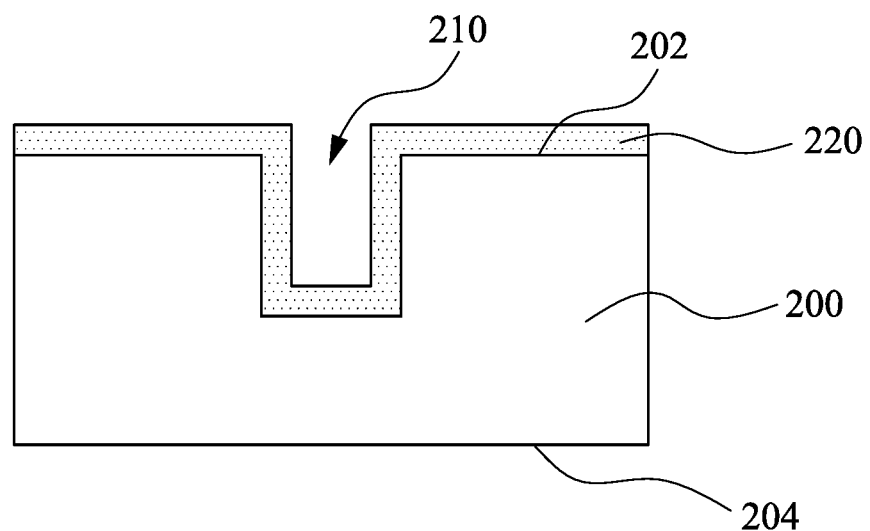

As set forth in block 120, a dielectric layer is formed on the front surface of the substrate and in the deep trench isolation structure. This is illustrated in FIG. 2B, where the dielectric layer 220 blankets the front surface 202 of the substrate and lines the sidewalls and bottom of the deep trench 210. The dielectric layer may be a thermal dielectric layer or any other suitable isolation material. The dielectric layer 220 may be deposited using a CVD process or a PVD process. The CVD process may be plasma enhanced chemical vapor deposition (PECVD) including ICPECVD, a low pressure chemical vapor deposition (LPCVD) or an atomic layer deposition (ALD) with or without plasma. In some embodiments, regardless the shape of the deep trench isolation structure, a void remains in the deep trench 210 after the deposition of the dielectric layer 220. In other words, the dielectric layer 220 does not fill in the deep trench 210.

Figure 2C:
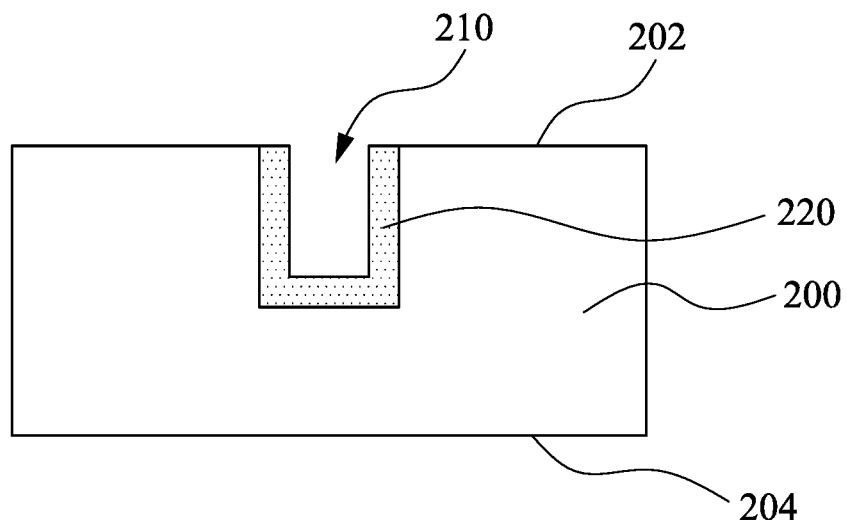

As set forth in block 130, a portion of the dielectric layer is removed from the front surface of the substrate. This is illustrated in FIG. 2C, where a portion of the dielectric layer 220 is removed by, for example etching, and the remaining dielectric layer 220 lines the sidewalls and bottom of the deep trench 210.

Figure 2D:
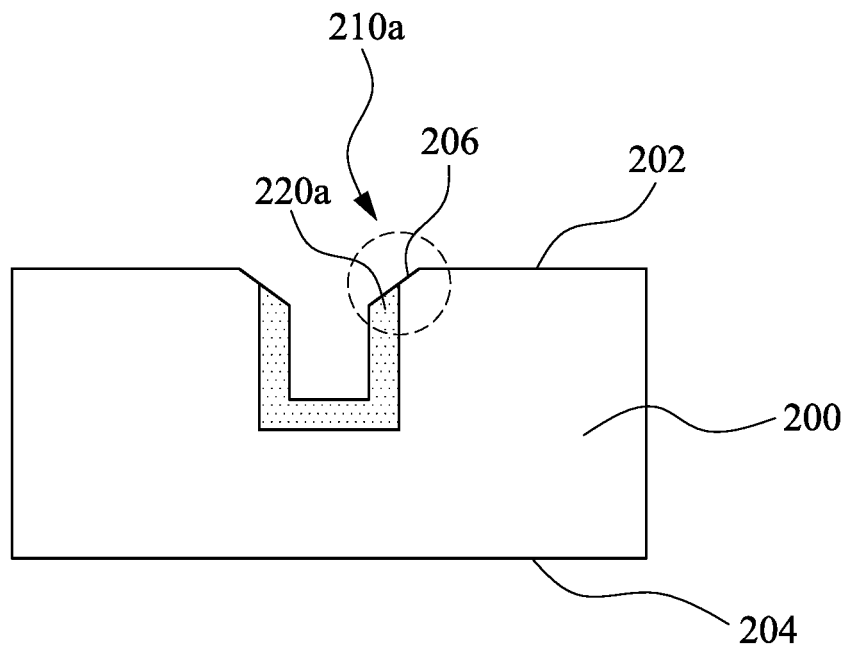
Figure 2E:
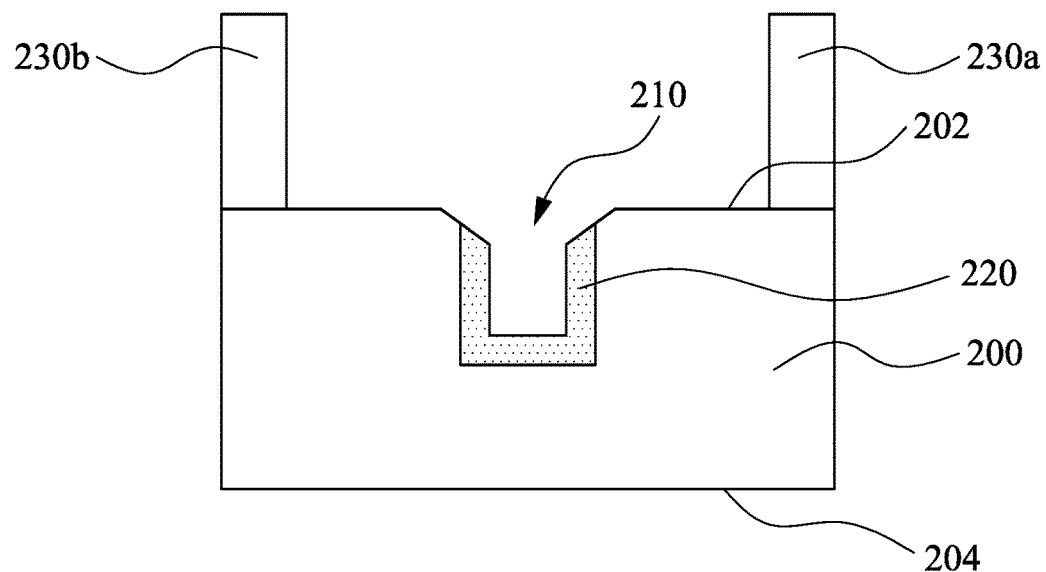

As set forth in block 140, a portion of the substrate at the opening of the deep trench isolation structure is removed. This is illustrated in FIG. 2D, where a portion of the substrate 200 at the opening of the deep trench 210 is removed by, for example, etching. In the substrate 200 etching process, a portion of the dielectric layer 220 is also removed. Please turn to FIG. 2I for an enlarge view of an area A shown in FIG. 2D. When performing substrate 200 etching at the opening of the deep trench 210, a chamfered portion 210a is created at the opening of the deep trench 210. Due to different etching rates, the substrate 200 is exposed through the chamfered portion 210a as a lip portion 206 of the opening where the etching is conducted, while the dielectric layer 220 is etched further down to a level that is below the front surface 202 of the substrate 200 so as to form a mouth portion 220a. The lip portion 206 and the mouth portion 220a together form a smooth slope slanting inwardly to the void defined by the deep trench 210.

Returning back to FIG. 2D, the substrate 200 and the dielectric layer 220 recess at the opening of the deep trench 210 such that the opening of the deep trench 210 has the chamfered portion 210a including the lip portion 206 (i.e., the chamfered substrate portion) that is not covered by the dielectric layer 220 and the mouth portion 220a.

Figure 2F:
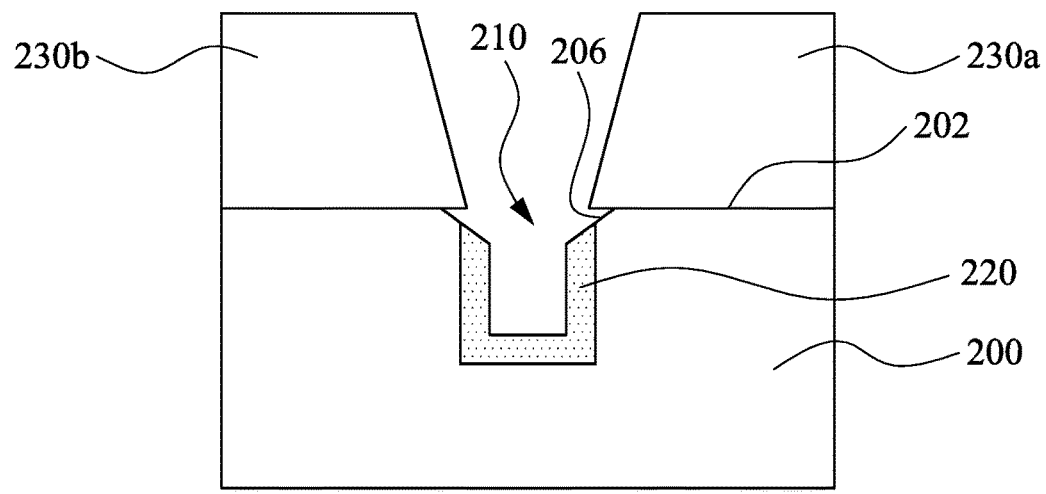

As set forth in block 150 of FIG. 1, an epitaxial layer is formed on the substrate. This is illustrated in FIGS. 2E to 2H, where the epitaxial layer 230 grows from either side of the substrate 200. Please turn to FIG. 2E. The growth of epitaxial layer 230 starts as two pieces 230a and 230b from opposite end on the front surface 202 of the substrate 200. More specifically, the opposite end refers to either side of the deep trench 210. The epitaxial layers 230a, 230b extend toward the deep trench 210 and gradually cover the front surface 202 of the substrate 200 as shown in FIG. 2F. It should be understood that in some embodiments, the deep trench 210 retains the void, and the void should be preserved after the formation of the epitaxial layer 230. As the epitaxial layers 230a, 230b reach the opening of the deep trench 210, the epitaxial layer does not contact the dielectric layer 220 at the mouth portion 220a, because the mouth portion 220a is below the surface level of the front surface 202. Formation of an epitaxial layer typically requires a flat platform and consistent material. In the present embodiment, three different materials underlie the epitaxial layer 230, including the substrate 200, the dielectric layer 220 and the void. The mouth portion 220a recesses inwardly at the opening, and the lip portion 206 encircles the mouth portion 220a. As a result, when the epitaxial layers 230a, 230b reach the chamfered portion 210a, the epitaxial layers 230a, 230b make contact with the substrate 200, i.e., the lip portion 206 and skip the mouth portion 220a. In this regard, the formation of the epitaxial layer 230 is conducted over the substrate 200 so as to reduce the occurrence of any defects.

Figure 2G:
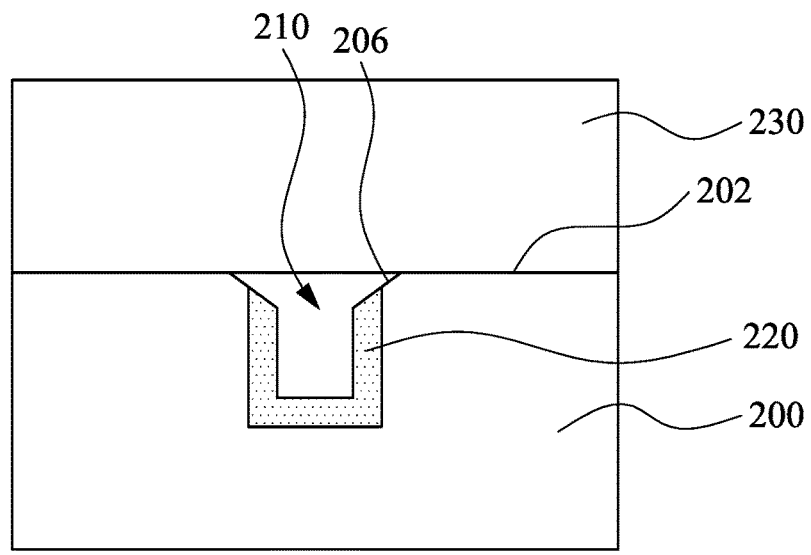
Figure 2H:
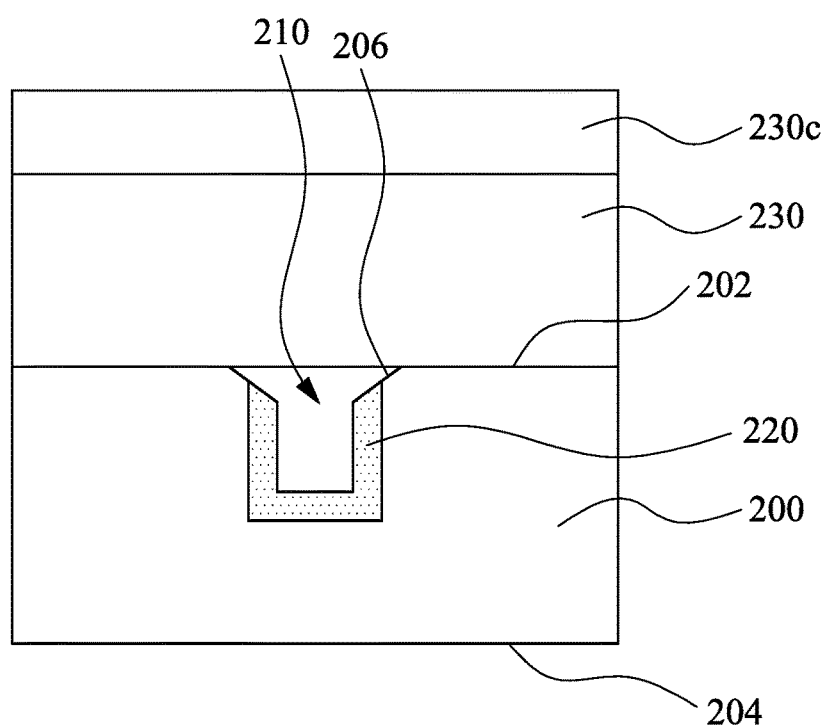
Figure 2I:
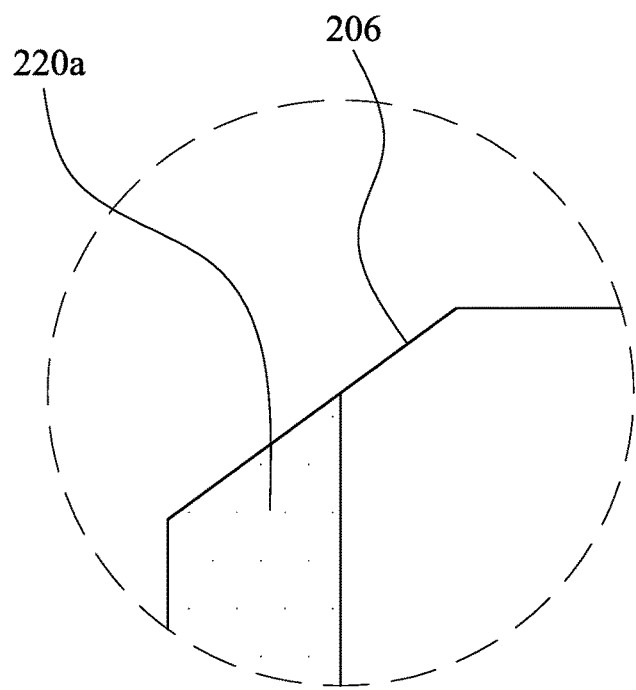
FIG. 2I is an enlarge view of an area A shown in FIG. 2D.

Attention is now invited to FIG. 2G. The epitaxial layers 230a, 230b cross the opening of the deep trench 210 and merge to form the epitaxial layer 230. The growth of the epitaxial layer continues as shown in FIG. 2H, where a first upper epitaxial layer 230c is deposited over the epitaxial layer 230. After the formation of the epitaxial layer 230, the quality of the subsequent deposition of the first upper epitaxial layer 230c can be ensured because the first upper epitaxial layer 230c is formed on the uniform material of the epitaxial layer 230. In addition to the formation process described above to avoid defects, the growth of the first upper epitaxial layer 230c allows a defect free epitaxial layer as the foundation for the subsequent process.

As shown in FIGS. 2G and 2H, after the epitaxial layers 230a, 230b merge to one piece, the opening of the deep trench isolation structure is sealed. The void of the deep trench 210 is preserved, and in one embodiment the deep trench isolation structure and the epitaxial layer 230 collectively define an air chamber. The air chamber functions as the isolation means in the deep trench 210. In this embodiment, the void remains empty of solid material but only air. It should be understood that the deep trench 210 is formed at the front surface 202 of the substrate 200 and before wafer bonding occurs. That is to say, the defects happens afterward can be cured through thermal-related treatment with a temperature higher than 500° C.

Figure 3A:
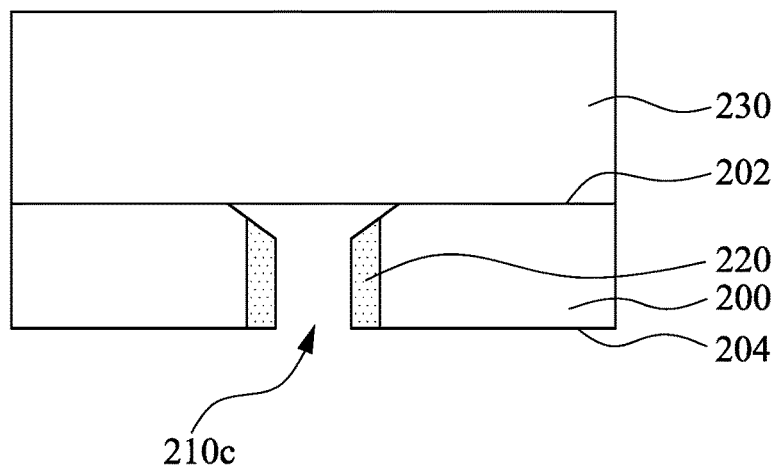
FIGS. 3A-3C are schematic cross-sectional diagrams illustrating embodiments of the method shown in FIG. 1 in accordance with the instant disclosure.

Referring back to FIG. 2G, after the formation of the epitaxial layer 230, in another embodiment, the deep trench 210 undergoes further processing. Attention is now invited to FIG. 3A. The substrate 200 is thinned by, for example, etching, from the back surface 204 until the deep trench 210 is opened at the bottom or accessible through the back surface 204. The dielectric layer 220 at the bottom of the deep trench 210 is removed as the trench opens. The modified deep trench isolation structure is designated as 210c in FIG. 3A. The sealed air chamber is then reopened, and a portion of the epitaxial layer 230 is exposed.

Figure 3B:
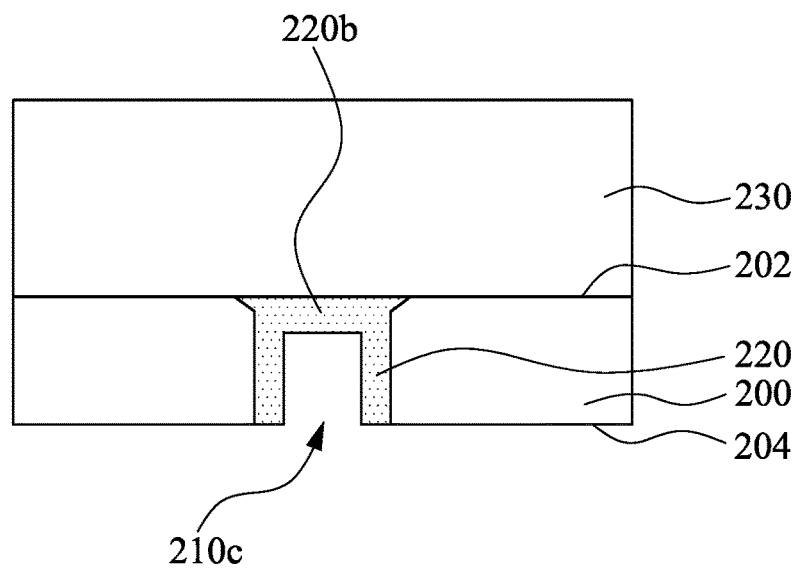

Attention is now invited to FIG. 3B, where a front dielectric layer is formed. Because the deep trench 210c is accessible through the back surface 204 and the epitaxial layer 230 seals the other end of the deep trench 210c, the front dielectric layer 220b is deposited on the epitaxial layer 230. The front dielectric layer 220b joins with the dielectric layer 220 on the sidewalls of the deep trench 210c. Compared with the deep trench 210 shown in FIG. 2G, the deep trench 210c opens toward the back surface 204 and the dielectric layer 220, 220c lines the sidewalls of the deep trench 210c and the exposed portion of the epitaxial layer 230.

Figure 3C:
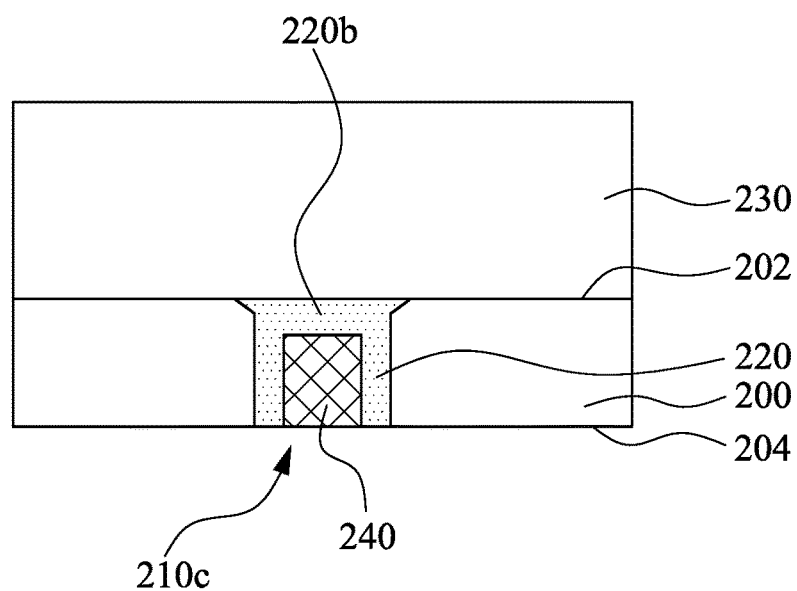

Attention is now invited to FIG. 3C, where a first material is deposited in the deep trench isolation structure. Unlike the air chamber where no solid material is present in the deep trench 210, the first material, i.e., a conductive material 240 in one embodiment, fills in the void of the deep trench 210c and levels with the back surface 204 of the substrate 200. The deep trench 210c is still formed before wafer bonding, although it opens on the back surface 204 and is filled with conductive material 240. The device, for example, an interconnect layer or more, is constructed over the epitaxial layer 230 that is on the front surface 202. Again, any defects occurring during the formation of the deep trench 210c and the epitaxial layer 230 can be treated without temperature restriction because the deep trench 210c is formed before wafer bonding.

Figure 4A:
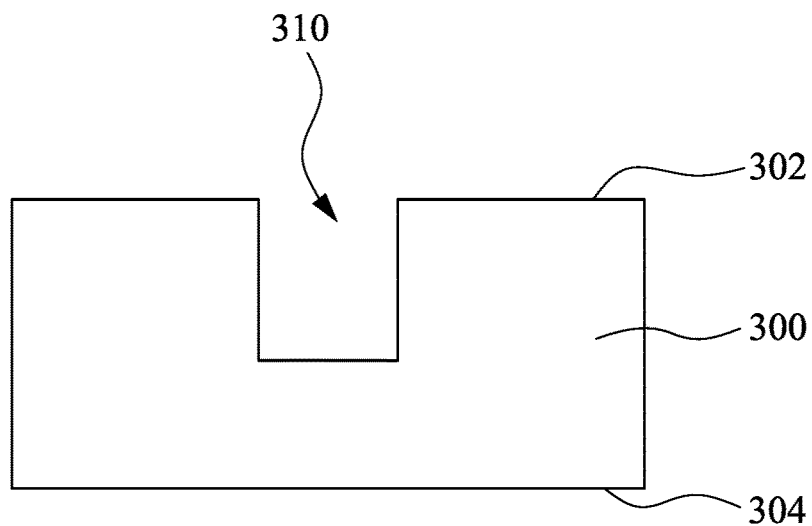
FIGS. 4A-4F schematic cross-sectional diagrams illustrating embodiments of the method shown in FIG. 1 in accordance with the instant disclosure.

Attention is now invited to FIG. 4A, where another embodiment is provided. The substrate 300 has a front surface 302 (also referred to as a front side) and a back surface 304 (also referred to as a back side). For a backside illuminated image (BSI) sensor device, incident radiation enters the substrate 300 through the back surface 304. In some embodiments, the substrate 300 has a thickness ranging from 100 µm to 500 µm. The substrate 300 includes various regions and for the sake of simplicity, only a deep trench isolation is shown in FIGS. 4A through 4F.

A patterned hard mask layer (not shown) is formed over the front surface 302 of the substrate 300 and undergoes a photolithography process. As a result, the patterned hard mask is formed with openings that are further etched to form a deep trench isolation structure 310, for example, by using a dry etching process known in the art. The deep trench isolation structure 310 opens at the front surface 302 of the substrate 300. The deep trench isolation structure 310 has a depth in a range from approximately 1 µm to 3 µm. The deep trench isolation structure 310 may resemble rectangular shape, trapezoidal shape, elongated elliptical shape or any other suitable geometric configuration.

Figure 4B:
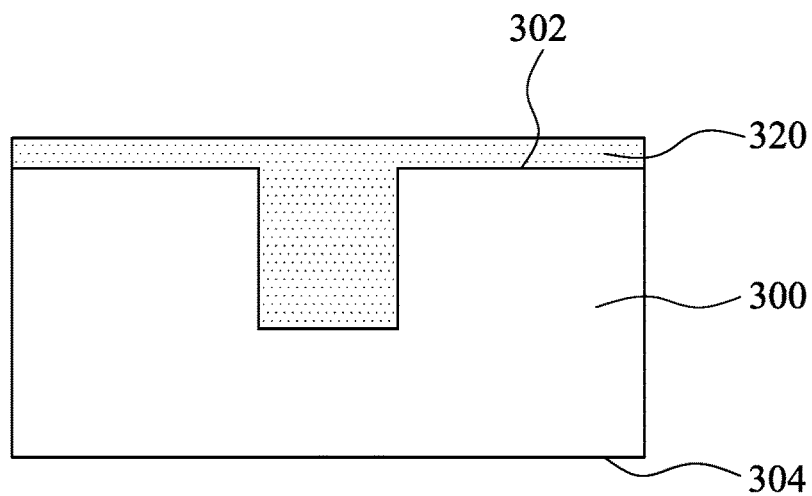

Attention is now invited to FIG. 4B, where a first material fills in the deep trench isolation structure. The first material, i.e., a dielectric layer 320 in one embodiment, overfills the deep trench 310 and blankets the front surface 302 of the substrate 300. Unlike the dielectric layer 220, the dielectric layer 320 fills in the void defined by the deep trench 310. The dielectric layer may serve as an etch stop layer or any other suitable material. In this embodiment, regardless the shape of the deep trench 310, the void is fully occupied by the dielectric layer 320.

Figure 4C:
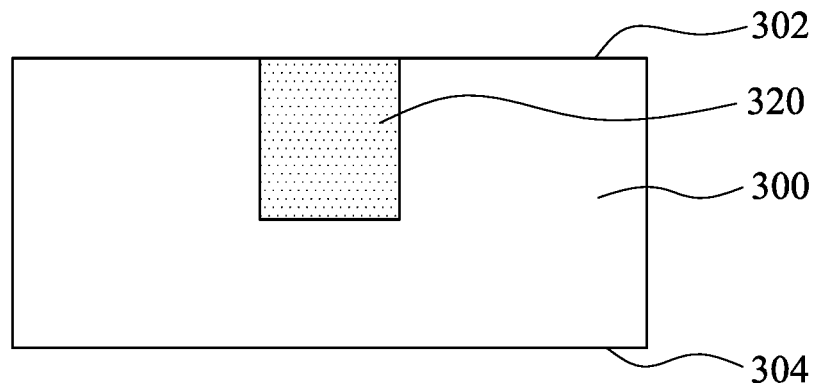
Figure 4D:
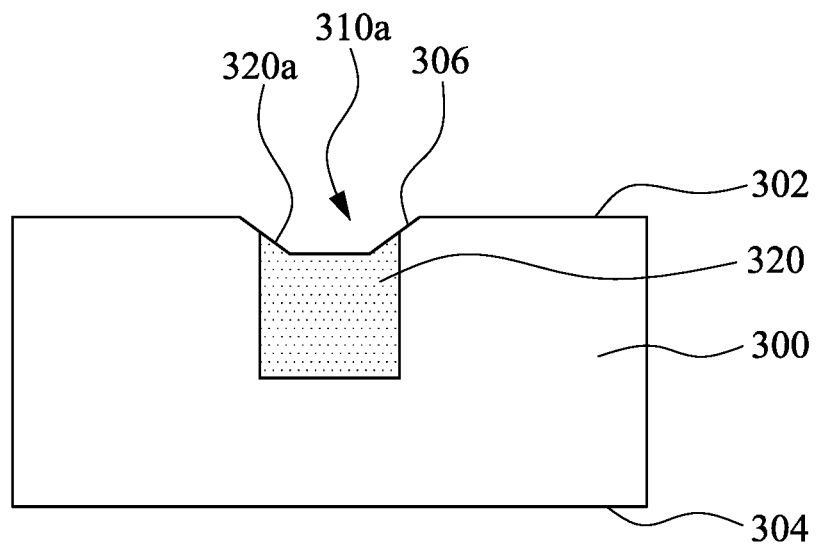

A portion of the dielectric layer 320 is removed from the front surface 302 of the substrate 300. This is illustrated in FIG. 4C. The dielectric layer 220 on the front surface 302 of the substrate 300 is removed by, for example etching, and the remaining dielectric layer 320 is retained in the deep trench 310. Attention is now invited to FIG. 4D. Subsequently, a portion of the substrate 300 at the opening of the deep trench isolation structure is removed by, for example, etching. In the substrate 300 etching process, a portion of the dielectric layer 320 is also removed. When performing substrate 300 etching at the opening of the deep trench 310, a chamfered portion 310a is created at the opening of the deep trench 310. Due to different etching rates, the substrate 300 is exposed through the chamfered portion 310a as a lip portion 306 of the opening where the etching is conducted, while the dielectric layer 320 is etched further down to a level that is below the front surface 302 of the substrate 300 so as to form a depressed portion 320a. The depressed portion 320a is below the level of the front surface 302 as well as the opening of the deep trench 310. The lip portion 306 (i.e., the chamfered substrate portion) is exposed and not covered by the dielectric layer 320.

Figure 4E:
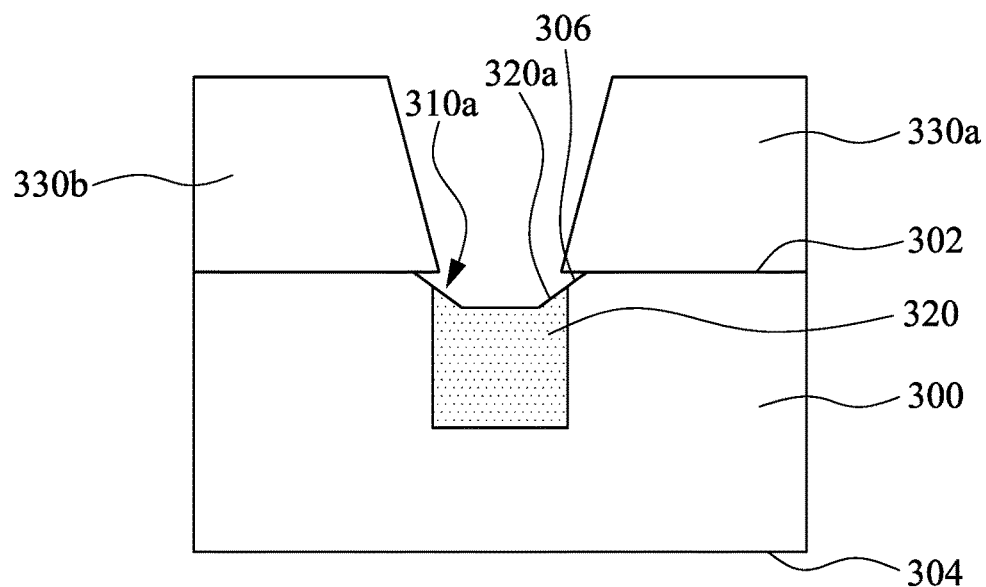

Attention is now invited to FIG. 4E, where an epitaxial layer 330 grows from either side of the substrate 300. The growth of epitaxial layer 330 starts as two pieces 330a and 330b from either side of the deep trench 310. The epitaxial layers 330a, 330b extend toward the deep trench 310 and gradually cover the front surface 302 of the substrate 300. As the epitaxial layers 330a, 330b reach the opening of the deep trench 310, the epitaxial layers 330a, 330b does not contact the depressed portion 320a of the dielectric layer 320 because the depressed portion 320a is below the surface level of the front surface 302.

Figure 4F:
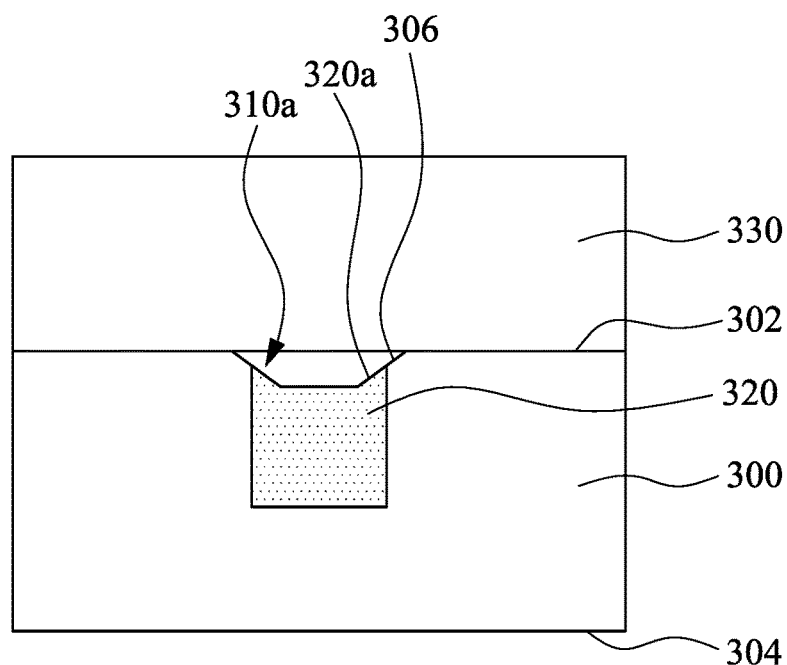

Please turn to FIG. 4F. The epitaxial layers 330a, 330b cross the deep trench 310 and merge to form the epitaxial layer 330. Because the depressed portion 320a recesses inwardly at the opening of the deep trench 310, a space is created when the epitaxial layer 330 seal the deep trench 310. Although the deep trench 310 is solidly filled by the dielectric layer 320, because the formation of the chamfered portion 310a, an air chamber in a much smaller scale in comparison with the embodiment shown in FIG. 2G is still present in between the dielectric layer 320 and the epitaxial layer 330. The growth of the epitaxial layer may continue for the subsequent deposition of other material.

Figure 5:
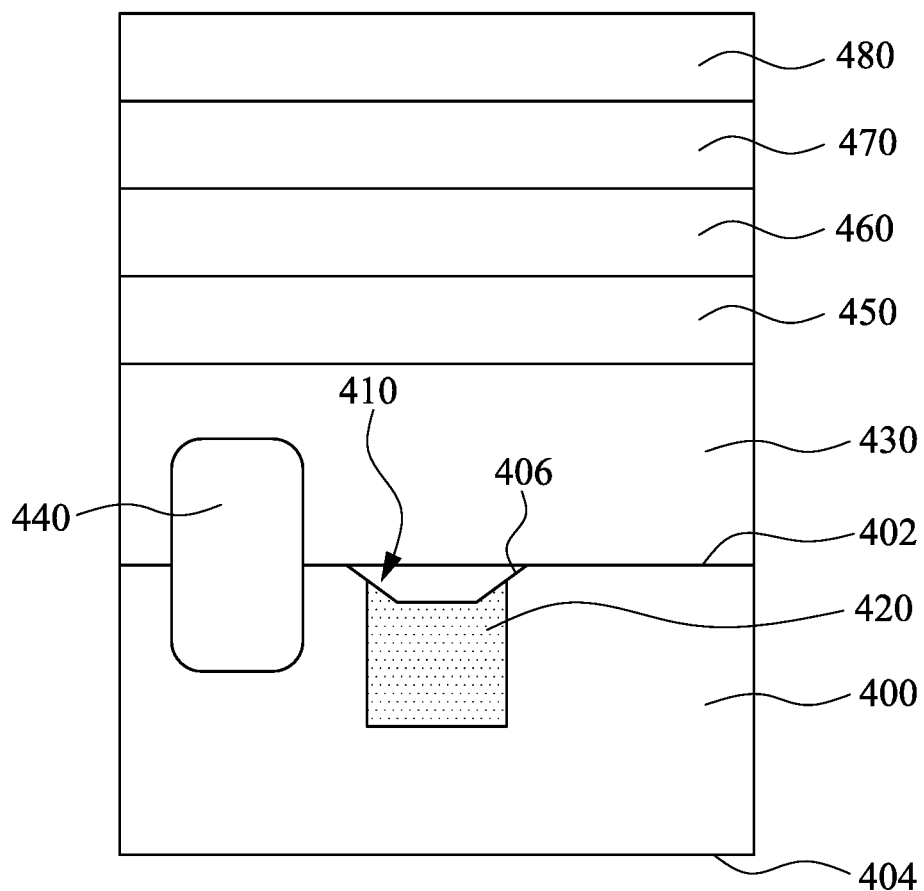
FIG. 5 is a schematic cross-sectional diagram illustrating a deep trench isolation structure in an image sensor device in accordance with some embodiments of the instant disclosure.

Attention is now invited to FIG. 5, where an image sensor device 40 in accordance with an embodiment of the instant disclosure is provided. The image sensor device includes a substrate 400 that has a front surface 402 and a back surface 404 opposite to the front surface 402. The substrate 400 may be a device substrate or a semiconductor substrate. The substrate 400 may be a silicon substrate doped with a P-type dopant such as boron. Alternatively, the substrate 400 can be doped with an N-type dopant such as phosphorous or arsenic, in which case the substrate 400 is an N-type substrate. The substrate 400 may include other elementary semiconductors such as germanium and diamond and optionally include a compound and or an alloy.

A deep trench 410 is formed in the substrate 400, opening toward the front surface 402. A dielectric layer 420 is disposed in the deep trench 410 and fills in the void defined by the deep trench 410. A chamfered portion 406 is formed at the opening of the deep trench 410, where the dielectric layer 420 recesses inwardly so as to avoid contact with the material disposed on the front surface 402 of the substrate 400.

A radiation detection device is formed in the substrate 400 next to the deep trench 410. The radiation detection device 440 is formed by performing an ion implantation process on the substrate 400 from the front side 404. The ion implantation process implants the substrate 400 with a dopant having an opposite doping polarity as the substrate 400. In the embodiment shown in FIG. 5, the radiation detection device 440 is formed at the front surface 402. In another embodiment, depending on the design needs and manufacturing requirements, the radiation detection device 440 may be formed further away from the front surface 402. The position or location of the radiation detection device 440 may be adjusted by tunning an implantation energy level of the implantation process used to form the radiation detection device 440. The radiation detection device 440 is operable to sense or detect radiation waves projected toward the radiation detection device 440 through the back surface 404 of the substrate 400. The radiation detection device 440 may be able to sense or detect radiation having specific wavelengths, which correspond to lights of different colours. In an embodiment, the radiation detection device 440 includes a photodiode. In other embodiments, the radiation detection device 440 may include other types of photodiodes, photogates, reset transistors, source follower transistors or transfer transistors.

An epitaxial layer 430 is formed over the front surface 402 and the radiation detection device 440. In addition, the epitaxial layer 430 seals the opening of the deep trench 410. As discussed above, electrical cross-talk in the forms of dark currents and white pixels may be caused by defects along the surface of the deep trench isolation structure. These defects are cured by the airy deep trench 410 in the present embodiment. During the operation of the image sensor device 40, optical cross-talk may also occur when photons from the radiation waves that are intended to be received by one radiation detection device end up being received by an unintended neighbouring radiation detection device. The deep trench 410 that has an air chamber provide sufficient isolation between the neighbouring radiation detection devices, thus substantially reducing optical cross-talk in addition to reduce electrical cross-talk.

An interconnect structure 450 is formed over the epitaxial layer 430. The interconnect layer 450 includes a plurality of patterned dielectric layers and conductive layers that provide interconnection (E.g., wiring) between the various doped features, circuitry and input/output of the image sensor device 40. A second upper epitaxial layer 460 is formed on the interconnect structure 450, acting as a buffer layer. The second upper epitaxial layer 460 may be formed by CVD, PVD or other suitable techniques. The second epitaxial layer 460 is planarized to form a smooth surface by a chemical mechanical polishing (CMP) process.

A metal layer 470 is formed on the second upper epitaxial layer 460. The metal layer 470 may include an interlayer dielectric (ILD) and a multilayer interconnect (MLI) structure formed in a configuration such that the ILD separates and isolates each MLI structure from other MLI structures. The MLI structure includes contacts/vias and metal lines formed on the second upper epitaxial layer 460. In one embodiment, the MLI structure includes conductive materials such as aluminium, aluminium/silicon/copper alloy, titanium, titanium nitride, tungsten, polysilicon, metal silicide or combination thereof. The metal layer 470 may be formed by a process including PVD, CVD or the like. Other manufacturing techniques to form the metal layer 470 may include photolightography processing and etching to pattern the conductive materials for vertical connection (contacts/vias) and horizontal connection (conductive lines).

A carrier 480 is then bonded with the metal layer 470 so that processing of the back surface 404 of the substrate 400 can be performed. The carrier 480 may be similar to the substrate 400 and includes a silicon material. Alternatively, the carrier 480 may optionally include a glass substrate. The carrier 480 provides protection for the various features formed on the front surface 402 of the substrate 400. The carrier 480 also provides mechanical strength and support for processing the back surface 404 of the substrate 400.

Compared to traditional BSI image sensor device, the deep trench isolation structure discussed in various embodiment is formed from the front side of the substrate and before the carrier is disposed. It implies that an annealing process may optionally be performed to enhance bonding strength between the layers or cure defects in the deep trench isolation structure without the temperature restriction, which cannot be higher than 500° C. in the presence of a carrier. Furthermore, the deep trench isolation structure is lined with a dielectric layer and the overlying epitaxial layer collectively define an air chamber in between for a secure isolation means. Overall, the profile of the deep trench isolation structure can be fine tuned through high-temperature thermal treatment, and therefore electrical cross-talk or charge leakage can be minimized in the image sensor device.

In some embodiments, an image sensor device that includes a deep trench formed at the front surface of the substrate, and the deep trench has sidewalls, a bottom and an opening. A dielectric layer is disposed along the sidewalls and bottom of the deep trench isolation structure. An epitaxial layer is disposed over the substrate and the dielectric layer. The deep trench isolation structure and the epitaxial layer collectively define an air chamber.

Still another of the broader forms of the instant disclosure involves an image sensor device that includes a substrate having a front surface and a back surface and an epitaxial layer disposed on the front surface of the substrate. A deep trench is disposed at the back surface of the substrate. The deep trench has sidewalls and a bottom defined by the epitaxial layer. A dielectric layer is disposed along the sidewalls and the bottom of the deep trench.

In some embodiments, an image sensor device includes a substrate having a front surface and a back surface. A deep trench is disposed at the front surface of the substrate. A dielectric layer is disposed in the deep trench, and the dielectric layer fills a portion of the deep trench. A first epitaxial layer is disposed on the front surface of the substrate. The deep trench, the dielectric layer and the first epitaxial layer collectively define an air chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a substrate having a front surface and a back surface;
   a deep trench disposed at the front surface of the substrate, the deep trench having sidewalls, a bottom and an opening;
   a dielectric layer disposed along the sidewalls and the bottom of the deep trench; and
   an epitaxial layer disposed on the front surface of the substrate, wherein the deep trench and the epitaxial layer collectively define an air chamber and the dielectric layer and the epitaxial layer directly border the air chamber.

2. The image sensor device of claim 1, wherein the deep trench has a chamfered portion at an interface between the epitaxial layer and the front surface of the substrate.

3. The image sensor device of claim 2, wherein the chamfered portion of the deep trench allows a portion of the substrate to be exposed from the dielectric layer.

4. The image sensor device of claim 2, wherein the dielectric layer is lower than the chamfered portion.

5. The image sensor device of claim 1, wherein the dielectric layer is a thermal dielectric layer.

6. The image sensor device of claim 1, wherein the epitaxial layer seals the opening of the deep trench.

7. The image sensor device of claim 1, wherein the dielectric layer is spaced apart from the epitaxial layer.

8. An image sensor device comprising:
a substrate having a front surface and a back surface;
a deep trench disposed at the front surface of the substrate;
a dielectric layer disposed in the deep trench, the dielectric layer filling a portion of the deep trench; and
a first epitaxial layer disposed on the front surface of the substrate, wherein the deep trench, the dielectric layer and the first epitaxial layer collectively define an air chamber and the dielectric layer and the first epitaxial layer directly border the air chamber.

9. The image sensor device of claim 8, wherein the deep trench has a chamfered portion at an interface between the first epitaxial layer and the front surface of the substrate.

10. The image sensor device of claim 9, wherein the chamfered portion of the deep trench allows a portion of the substrate to be exposed from the dielectric layer.

11. The image sensor device of claim 9, wherein the dielectric layer has a depressed portion lower than the chamfered portion.

12. The image sensor device of claim 9, wherein the chamfered portion of the deep trench is slanting inwardly.

13. The image sensor device of claim 8, wherein the dielectric layer is a thermal dielectric layer.

14. The image sensor device of claim 8, wherein the dielectric layer is spaced apart from the first epitaxial layer.

15. The image sensor device of claim 8, further comprising a radiation detection device disposed in the substrate.

16. The image sensor device of claim 8, further comprising:
an interconnect structure disposed on the first epitaxial layer;
a second epitaxial layer disposed on the interconnect structure; and
a metal layer disposed on the second epitaxial layer.

17. An image sensor device, comprising:
a dielectric layer in a trench in a substrate;
an epitaxial layer disposed on the substrate; and
an air chamber directly bordering the epitaxial layer and the dielectric layer.

18. The image sensor device of claim 17, wherein a top surface of the dielectric layer and a bottom surface of the epitaxial layer define the air chamber.

19. The image sensor device of claim 18, wherein the dielectric layer is spaced from a bottom surface of the substrate.

20. The image sensor device of claim 18, wherein the air chamber is tapered.

* * * * *